United States Patent [19]
Burns

[11] 4,330,790
[45] May 18, 1982

[54] TAPE OPERATED SEMICONDUCTOR DEVICE PACKAGING

[75] Inventor: Carmen D. Burns, San Jose, Calif.

[73] Assignee: National Semiconductor Corporation, Santa Clara, Calif.

[21] Appl. No.: 133,040

[22] Filed: Mar. 24, 1980

[51] Int. Cl.³ .................. H01L 29/00; H01R 43/02
[52] U.S. Cl. .................................... 357/70; 29/588; 29/827; 29/856; 174/52 PE; 357/72
[58] Field of Search .................. 29/827, 588, 841; 357/72, 70; 174/52 PE, 52 S; 228/180 A; 361/421

[56] References Cited

U.S. PATENT DOCUMENTS

| 3,374,537 | 3/1968 | Doelp, Jr. | 228/180 A X |
| 3,628,483 | 12/1971 | Pauza | 357/70 X |
| 3,767,839 | 10/1973 | Beal | 174/52 S |
| 3,859,718 | 1/1975 | Noe | 288/180 A X |
| 4,000,842 | 1/1977 | Burns | |
| 4,079,511 | 3/1978 | Grabbe | 29/827 |

Primary Examiner—Francis S. Husar
Assistant Examiner—Carl J. Arbes
Attorney, Agent, or Firm—Gail W. Woodward; James A. Sheridan; Neil B. Schulte

[57] ABSTRACT

A semiconductor device is bonded to a contact finger pattern which is located in a continuous tape. A metal package cup is fabricated from metal stock so as to have a flat rim portion around its periphery. A plastic insulating sheet is punched so that it forms an overlapping cover for the flat rim and is attached thereto. The tape mounted semiconductor device is then bonded to the inside of the cup and the metal fingers bonded to the insulating sheet covering the flat rim. Provision is made for one of the fingers to connect to the cup. Then the device is encapsulated using one of two techniques. In the first a cap that mates with the cup is provided with a bonded insulating film cover and is bonded to the cup with its overlying metal fingers, so that a metal housing results. An encapsulating material is then injected inside the housing by way of a hole in the cap. Alternatively the semiconductor device can be covered by a suitable casting material. The active device leads can then be severed from the tape and formed into their ultimate form so that the device can be tested in tape form prior to being excised from the tape.

10 Claims, 14 Drawing Figures

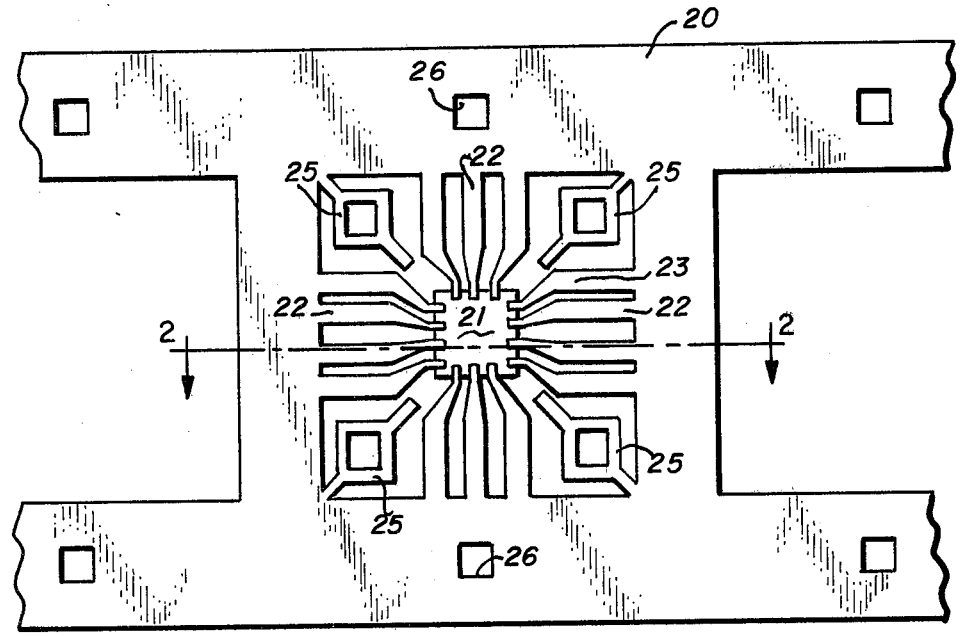
Fig_1
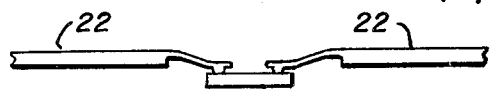
Fig_2
Fig_3
Fig_5
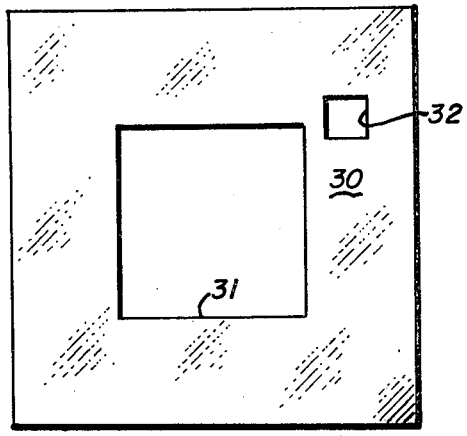
Fig_4
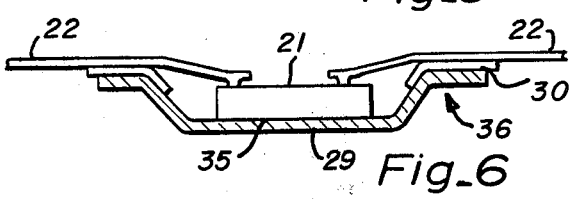
Fig_6
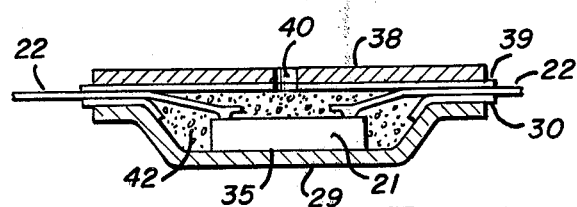
Fig_8
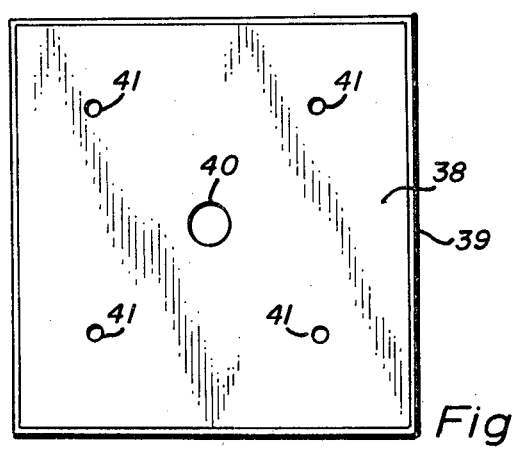
Fig_7
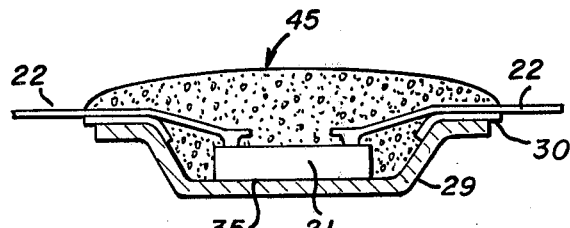
Fig_9

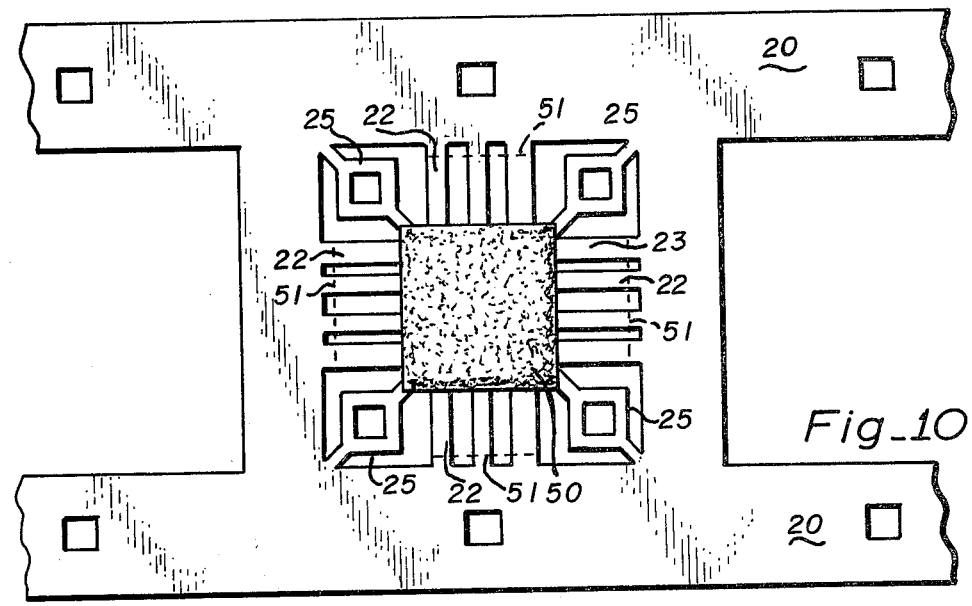
Fig_10
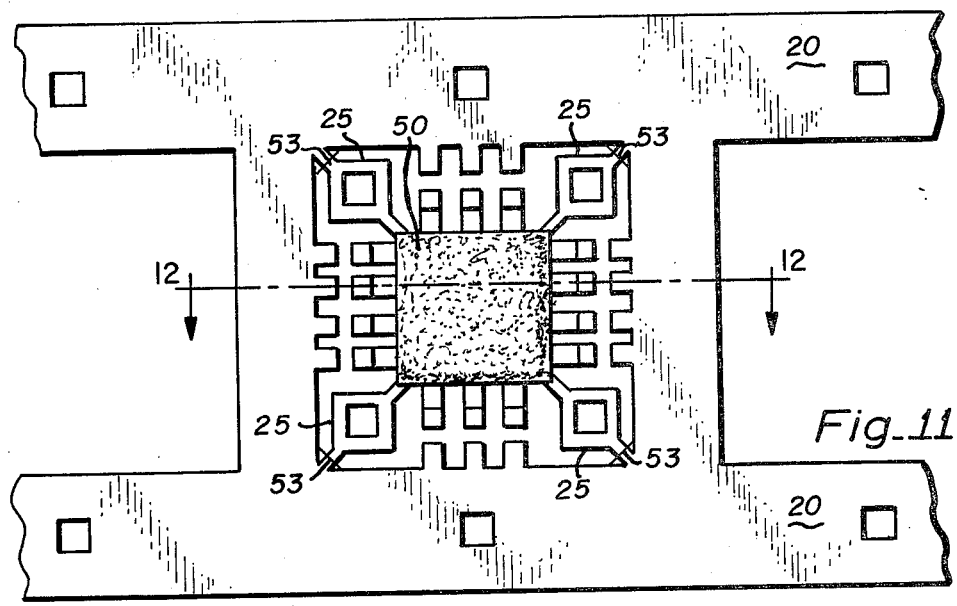
Fig_11
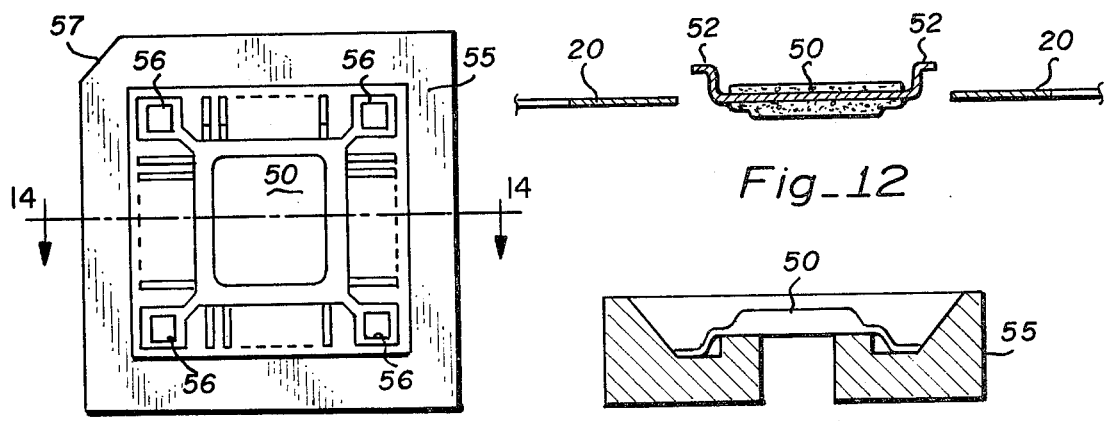
Fig_13
Fig_12
Fig_14

TAPE OPERATED SEMICONDUCTOR DEVICE PACKAGING

BACKGROUND OF THE INVENTION

The invention is intended for use in automatic semiconductor fabrication, using continuous tape handling through the encapsulation process. In the past, it has been suggested that the tape process be employed to fabricate semiconductor devices. My publication titled "TRENDS IN TAPE BONDING" in the April, 1979, issue of "Semiconductor International," details the automatic bonding of semiconductor devices to either all metal tape or composite tape. My U.S. Pat. No. 4,000,842, which issued Jan. 4, 1977, details a fabrication process for making tape and bonding semiconductor devices thereto.

In my copending application, Ser. No. 921,642, filed July 3, 1978 and titled "CONTROLLED COLLAPSE THERMOCOMPRESSION GANG BONDING," an improvement in bonding is set forth. The improvement relates to semiconductor device attachment to a continuous tape and to attachment of the tape bonded device to a secondary structure.

Typically, once a device is bonded to a tape, it is usually intended for application to a hybrid substrate. Alternatively a plastic housing can be transfer molded around the semiconductor device and the adjacent tape finger portions.

While the attachment of semiconductor devices to a tape structure is relatively fast, the subsequent encapsulation, particularly transfer molding, is relatively slow. In fact, transfer molding is not applicable to a continuous tape process. Generally, the tape must be cut up into segments that are batch transfer molded in a parallel process.

SUMMARY OF THE INVENTION

It is an object of the invention to employ a continuous tape assembly process to completely encapsulate a semiconductor device.

It is a further object of the invention to reduce the cost of semiconductor device encapsulation.

It is still a further object of the invention to speed up the assembly of encapsulated semiconductor devices.

These and other objects are achieved in the following manner. First, the semiconductor devices are bonded to the metal fingers of a continuous tape in a conventional process, using gang thermocompression bonding, as described in application Ser. No. 921,642, filed July 3, 1978. However, the tape includes a plurality of corner fingers, as well as the conventional bonding pad fingers. The tape mounted devices are encapsulated as follows:

A metal cup is fabricated from sheet stock. The cup is made deep enough to accommodate a semiconductor device and is formed to have a flat peripheral lip or face. A sheet of polyimide coated on both sides with B-staged epoxy or some other suitable adhesive, is punched out in the form of a ring, having an outside diameter slightly larger than the face of the metal cup and an inside diameter slightly larger than the semiconductor device. This ring is heat bonded to the flat face on the metal cup. The semiconductor device is then bonded to the bottom of the inside of the cup and the metal fingers heat-bonded to the exposed face of the polyimide ring. The ring may have an opening therein to permit bonding directly between the cup and one of the metal fingers.

Then the encapsulation is completed by casting an encapsulant in the open cup, so as to surround the semiconductor device and adjacent tape fingers. In this operation, the cup serves to confine the encapsulant during a subsequent batch cure. Alternatively, a metal cap or cover plate can be supplied with a coating of polyimide film which has both faces covered with B-staged epoxy adhesive. This cap can be bonded to the flat cup lip, so as to confine the semiconductor device and the adjacent portion of the metal fingers. The device is then encapsulated by a compound injected through a hole in the cap and the entire assembly subjected to a heat cure in a batch process.

Once the devices are encapsulated, the operating lead fingers are excised and formed to final shape. The finished device is held in place on the tape by the corner fingers. The tape mounted and encapsulated devices can then be tested while on the tape and marked in accordance with the test results.

Then the corner fingers can be excised and the device handled directly or the devices can be placed in a carrier assembly. The carrier mounted device can then be further tested and inserted into tubes for automatic handling and subsequent application to circuit boards.

BRIEF DESCRIPTION OF THE DRAWING

FIG. 1 is a top view of a section of tape showing a preferred finger pattern;

FIG. 2 is a cross-section of the tape of FIG. 1, taken along the line designated 2—2;

FIG. 3 is a cross-section view of a metal cup, prepared to accommodate the semiconductor device of FIGS. 1 and 2;

FIG. 4 shows a polyimide form that has been punched out of a strip;

FIG. 5 shows the form of FIG. 4, bonded to the cup of FIG. 3;

FIG. 6 shows the cross-section of the device of FIG. 2, secured to the cup of FIG. 5;

FIG. 7 shows a metal cover plate, with a polyimide sheet bonded thereto, suitable for application to the assembly of FIG. 6;

FIG. 8 is a cross-section of the structure of FIG. 6, with the cover-plate of FIG. 7 and an incapsulant injected through the cover-plate;

FIG. 9 is a cross-section of the structure of FIG. 6, with a cast encapsulant;

FIG. 10 is a top view of an encapsulated device, showing the initial excise lines of the pattern fingers;

FIG. 11 shows the devices after the fingers have been excised and formed;

FIG. 12 shows a device removed from the tape and mounted on a carrier;

FIG. 13 is a cross-section of a carrier mounted device taken at the line 13—13 in FIG. 12; and FIG. 14 is a cross-section through the carrier 55 at line 14—14 of FIG. 13.

DESCRIPTION OF THE INVENTION

In the following description, it is to be understood that the various process steps are adapted for automatic handling machines. The various steps are to be conducted using a tape process, wherein a continuous reel of tape transports the parts through the various machines at a high rate. As a reel of tape is unwound to enter a machine, it is wound back up on a reel as it exits the machine.

FIG. 1 shows a fragment of metal tape 20, that has been prepared to accommodate a semiconductor device 21. Only one pattern is shown. It is to be understood that a plurality of such patterns exist along the tape. Holes 26 act to index and transport the tape in the following process: A plurality of metal fingers 22 are configured to mate with the bonding pads on semiconductor device 21. The metal of tape 20 is copper fired half hard and coated with about 1000 Å of gold in accordance with my U.S. Pat. No. 4,188,438. It is preferred that each finger include a raised portion on its end, as disclosed in my above-identified publication and my patent application, 921,642, filed July 3, 1978. FIG. 2, which is a cross-section of FIG. 1, taken at line 2—2, shows bumped tape fingers 22, that have been thermocompression gang bonded to semiconductor device 21 at its bonding pads. Thirteen such fingers are shown, but more or fewer could be employed. A short finger is shown at 23 and four corner fingers are shown at 25. These fingers will be discussed in detail, below.

As a well-known alternative, semiconductor device 21 can be provided with raised bonding pad bumps. In this case the tape fingers can be either flat or bumped as desired.

FIG. 3 shows, in cross-section, a metal cup having a square outline that defines the encapsulated device. Cup 29 is formed from 5-mil thick sheet stock, composed of copper or a nickel iron alloy that has been plated with gold to a thickness of about 1000 Å.

FIG. 4 illustrates an insulating film 30, that is composed of, for example, 2-mil thick polyimide (such as Dupont, Kapton polyimide) coated on both faces with one-half mil of an adhesive such as B-staged epoxy. Film 30 is punched out of sheet stock to the shape shown, which has an outer diameter slightly greater than that of cup 29. The hole punched at 31 is slightly larger than the outer diameter of semiconductor device 21. As shown in FIG. 5, film 30 is heat and pressure bonded to cup 29, so as to leave a slight overlap at 33. Hole 32 is located on cup 29, so that when it is associated with tape 20, it is in registry with finger 23. This hole can be prepunched into film 30, as shown, or can be created later in the following process steps.

While the foregoing description shows insulating film 30 associated with cup 29, it is to be understood that film 30 could be applied to the metal finger pattern on tape 20. In this event the insulating film is carried on the tape until it is adhered to cup 29 as shown in FIGS. 5 and 6.

As shown in FIG. 6, the cup is associated with the tape mounted semiconductor device 21 by soldering or conductive epoxy cement at 35. In the event that no package contact is required, the bond at 35 can be any suitable adhesive or even omitted entirely. At this time, the tape fingers 22 and 25 are heat and pressure bonded to the upper face of film 30. The wide portion of the cup lip at 36 provides a good seal between the fingers and the insulating film 30. Tape finger 23 can be soldered or thermocompression bonded to cup 29, through hole 32.

FIG. 7 shows a top cap 38, which is to complete the housing. A metal cap 38 is made of the same material as cup 29, and has the same outer diameter. The metal cap is face bonded to a polyimide sheet 39, which is slightly larger than the cap and is otherwise similar to sheet 30. A fill hole is shown at 40 and, if desired, breather holes 41 can be included. Holes 40 and 41 pass through metal cup 38 and film 39.

As shown in FIG. 8, which is a cross-section of a capped device, film 39 is used to bond cap 38 to cup 29 over fingers 22, 23 and 25. After capping, a suitable encapsulating material 42 is injected via hole 40, and cured in place.

FIG. 9 shows an alternative encapsulation to the capping and injection of FIGS. 7 and 8. Here encapsulating material 45 is cast over semiconductor device 21 in cup 29, so as to complete the housing. A suitable material is disclosed in U.S. Pat. No. 4,043,969. If desired, the casting material can be finally pressed into the desired shape with a polycarbon tetrafluoride coating shaping tool (not shown).

In terms of the encapsulation, both of the above approaches employ a single material. If desired, the semiconductor can first be coated with a compatible material and then encapsulated as shown.

At this stage of the process the exposed gold on the leads is stripped off for recovery. Then the metal portions that will become the device leads are plated with a lead-tin solder alloy which will protect the metal and render the final device readily solderable.

The structure now looks like the showing in FIG. 10. The encapsulated semiconductor device is shown at 50 which denotes the upper surface of encapsulant 45 or cap 38, depending on which of the above processes is employed. The structure is secured to tape 20 by means of fingers 22, 23 and 25. To permit testing of tape mounted devices, leads 22 and 23 can be severed along lines 51 and formed into their desired final shape as shown at 52 in FIG. 11. Note that fingers 25 still secure the devices of the tape. FIG. 12 shows a cross-section of a tape mounted package 50 secured to a tape. The tape can be run through a high speed tester, which probes the cut and formed leads to make preliminary tests on the fully encapsulated devices.

FIG. 13 shows an encapsulated semiconductor device severed from the tape. This is done by excising the assembly at lines 53 in FIG. 11. A throwaway plastic carrier 55 holds the device. Tapered pins at 56 engage the holes in fingers 25 that remain after excision. Flat 57 permits automatic indexing of the carrier. FIG. 14 is a cross-section through carrier 55 at line 14—14 of FIG. 13. Such a holder can be made and used at very low cost and permits handling of the finished packaged product, prior to application to an actual circuit board. In the carrier, the semiconductor device in final form can be tested and marked. It is also suitable for automatic handling machinery in application to its ultimate destination such as a PW board or hybrid substrate. When the packaged semiconductor device is to be removed from the carrier, the external portions of original fingers 25 can be excised at the edge of the package and the carrier discarded.

While the final package has been shown as square with leads exiting on all four sides, it is to be understood that other shapes can be employed. For example, the shape can be round or rectangular with leads exiting on one or more slides.

A fabrication process for assembling semiconductor devices into housings at a high rate has been described. The process is amenable to automatic machinery. Upon reading the above description, alternatives and equivalents within the spirit and interest of the invention will occur to a person skilled in the art. Accordingly, it is intended that the scope of the invention be limited only by the following claims.

I claim:

1. A process for encapsulating a semiconductor device that is attached to a transport tape, said tape having a succession of metal finger patterns with each pattern including a central portion where the tips of said fingers conform to the bonding pads of said semiconductor device and are bonded thereto, said process comprising the steps:

forming a metal cup, having a recess with a diameter that exceeds the size of said semiconductor device and a flat peripheral edge;

forming a first insulating film into a ring shape, having an outer diameter slightly greater than the outer diameter of said cup, and an inner diameter greater than the diameter of said semiconductor device;

bonding said first insulating film between said flat edge of said cup and said fingers on said tape;

bonding said semiconductor device to the bottom of said recess in said cup and attaching said fingers by way of said first film to said cup; and encapsulating said semiconductor device inside said cup.

2. The process of claim 1, further including excising said fingers at a point spaced outside the outer dimension of said cup.

3. The process of claim 2, wherein said succession of finger patterns include a plurality of additional fingers that do not mate with said semiconductor device, but terminate at the inside of said flat edge and wherein said additional fingers are not excised in the step of claim 2, but serve to hold said cup in place on said tape during testing;

testing said semiconductor device; and excising said additional fingers to remove said encapsulated device from said tape.

4. The process of claim 1 further including the step of casting an encapsulating material inside said cup to cover said semiconductor and the associated portions of said fingers.

5. The process of claim 1, further including forming a metal coverplate, having a hole therein, and a shape that will match the outer edge of said cup;

forming a second insulating film slightly larger than said plate;

bonding said second insulating film to said plate and bonding said second film and plate to said flat edge; and injecting a potting compound through said hole inside said cup, to encapsulate said device.

6. The process of claim 3 further including the steps of fabricating an insulating carrier adapted to accommodate said encapsulated device and placing said encapsulated device on said carrier.

7. The process of claim 6, wherein said additional fingers have holes located therein, inside their excision points, and said carrier includes tapered posts that mate with said holes, whereby said encapsulated device can be secured to said carrier.

8. The process of claim 7, including the further step of excising said additional fingers at the edge of said cup, thereby to remove said encapsulated device from said carrier.

9. The process fabricated from the process of claim 1.

10. The product fabricated from the process of claim 6.

* * * * *